(12) United States Patent
Oh (10) Patent No.: US 8,178,960 B2
(45) Date of Patent: May 15, 2012

(54) STACKED SEMICONDUCTOR PACKAGE AND METHOD OF MANUFACTURING THEREOF

(75) Inventor: Joon-young Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 140 days.

(21) Appl. No.: 12/659,330

(22) Filed: Mar. 4, 2010

(65) Prior Publication Data
US 2010/0258930 A1 Oct. 14, 2010

(30) Foreign Application Priority Data
Apr. 9, 2009 (KR) .................. 10-2009-0030958

(51) Int. Cl.
*H01L 23/02* (2006.01)
(52) U.S. Cl. . 257/686; 257/685; 257/777; 257/E25.005; 257/E25.006; 257/E25.021; 257/E25.027; 257/E23.085
(58) Field of Classification Search .................. 257/686, 257/E25.006, E25.013, E25.018, E25.021, 257/E25.027, E23.085; 438/109, FOR. 368, 438/FOR. 426
See application file for complete search history.

(56) References Cited

U.S. PATENT DOCUMENTS

| 7,185,426 B1 | 3/2007 | Hiner et al. | |
| 7,245,008 B2 | 7/2007 | Lee | |
| 8,008,765 B2 * | 8/2011 | Kang | 257/686 |
| 2008/0136003 A1 | 6/2008 | Pendse | |
| 2008/0258289 A1 | 10/2008 | Pendse et al. | |
| 2009/0206461 A1* | 8/2009 | Yoon | 257/686 |
| 2010/0052135 A1* | 3/2010 | Shim et al. | 257/686 |

FOREIGN PATENT DOCUMENTS
KR 10-0842915 6/2008
* cited by examiner

*Primary Examiner* — Jasmine Clark
(74) *Attorney, Agent, or Firm* — Harness, Dickey & Pierce, P.L.C.

(57) ABSTRACT

Provided is a stacked semiconductor package and a method of manufacturing the same. The stacked semiconductor package may include a first semiconductor package, a second semiconductor package, and at least one electrical connection device electrically connecting the first and second semiconductor packages. The first semiconductor package may include a first re-distribution pattern on a first semiconductor chip and a first sealing member on the first substrate, the first sealing member may include at least one first via to expose the first re-distribution pattern. The second semiconductor package may include a second re-distribution pattern on a second semiconductor chip and a second sealing member on a lower side of the second substrate, the second sealing member may include at least one second via to expose the second re-distribution pattern. An electrical connection device may be between the first and second vias to connect the first and the second re-distribution patterns.

13 Claims, 11 Drawing Sheets

STACKED SEMICONDUCTOR PACKAGE AND METHOD OF MANUFACTURING THEREOF

CROSS-REFERENCE TO RELATED APPLICATIONS

This application claims priority under 35 U.S.C. §119 to Korean Patent Application No. 10-2009-0030958, filed on Apr. 9, 2009, in the Korean Intellectual Property Office (KIPO), the entire contents of which are herein incorporated by reference.

BACKGROUND

1. Field

Example embodiments of inventive concepts relate to a semiconductor device and a method of manufacturing the semiconductor device, and more particularly, to a stacked semiconductor package and a method of manufacturing the stacked semiconductor package.

2. Description of the Related Art

In accordance with a trend towards a miniaturization of portable electronic devices, a semiconductor package may be required to be small, slim, and light-weight. Thus, a stacked semiconductor package, in which a plurality of semiconductor packages may be stacked, may be used. Furthermore, a need for stacked semiconductor packages that perform multiple functions may be increased since portable electronic devices perform multiple functions.

In a stacked semiconductor package, in order to have a reliable electrical connection between stacked semiconductor packages, considerations of the stack structure and stacking method may be important.

SUMMARY OF INVENTIVE CONCEPTS

Example embodiments of inventive concepts provide a stacked semiconductor package that may have a relatively reliable electrical connection between stacked semiconductor packages and a semiconductor package module that may use the stacked semiconductor packages. Example embodiments of inventive concepts also provide for a method of manufacturing the stacked semiconductor package. However, example embodiments of inventive concepts should not be construed as being limited to the embodiments set forth therein.

In accordance with example embodiments of inventive concepts, a stacked semiconductor package may include a first semiconductor package, a second semiconductor package on the first semiconductor package, and at least one electrical connection device electrically connecting the first semiconductor package and the second semiconductor package. The first semiconductor package may include a first substrate, at least one first semiconductor chip on the first substrate, a first re-distribution pattern on the at least one first semiconductor chip, and a first sealing member on the first substrate, the first sealing member covering the at least one first semiconductor chip and having at least one first via exposing the first re-distribution pattern. The second semiconductor may include a second substrate, at least one second semiconductor chip on the second substrate, a second re-distribution pattern on the at least one second semiconductor chip, and a second sealing member on a lower side of the second substrate, the second sealing member covering the at least one second semiconductor chip and having at least one second via exposing the second re-distribution pattern. In accordance with example embodiments of inventive concepts, the at least one electrical connection device may be in the at least one first via and the at least one second via and may connect the first re-distribution pattern and the second re-distribution pattern.

In accordance with example embodiments of inventive concepts, a stacked semiconductor package may include a first semiconductor package, a second semiconductor package on the first semiconductor package, and at least one electrical connection device electrically connecting the first semiconductor package and the second semiconductor package. The first semiconductor package may include a first substrate, at least one first semiconductor chip on the first substrate, a first re-distribution pattern on the at least one first semiconductor chip, and a first sealing member on the first substrate, the first sealing member covering the at least one first semiconductor chip and having at least one first via exposing the first re-distribution pattern. The second semiconductor package may include a second substrate, at least one second semiconductor chip on the second substrate, and a second sealing member on an upper side of the second substrate, the second sealing member covering the at least one second semiconductor chip. In accordance with example embodiments of inventive concepts, the at least one electrical connection device may be in the at least one first via and may connect the first re-distribution pattern and to the second substrate.

According to example embodiments of inventive concepts, there is provided a stacked semiconductor package. The stacked semiconductor package may include a first semiconductor package, a second semiconductor package stacked on the first semiconductor package, and at least one electrical connection means that electrically connects the first semiconductor package and the second semiconductor package.

The first semiconductor package may include a first substrate, at least one semiconductor chip mounted on the first substrate, a first re-distribution pattern formed on the first semiconductor chip, and a first sealing member that is formed on the first substrate to cover the first semiconductor chip and has at least one first via to expose the first re-distribution pattern. The second semiconductor package may include a second substrate, at least one second semiconductor chip mounted on a lower side of the second substrate, a second re-distribution pattern formed on the second semiconductor chip, and a second sealing member that is disposed on a lower side of the second substrate to cover the second semiconductor chip and has at least one second via to expose the second re-distribution pattern. The electrical connection means may be inserted into the first and second vias to directly connect the first re-distribution pattern and the second re-distribution pattern.

The first re-distribution pattern and the second re-distribution pattern may be formed of materials having about the same thermal expansion coefficients with respect to each other. Also, the first semiconductor package and the second semiconductor package may be formed of materials having about the same thermal expansion coefficients with respect to each other.

The first via may include a via that is formed from the upper surface of the first sealing member to the first re-distribution pattern to expose the first re-distribution pattern, and the second via may include a via that is formed from the lower surface of the second sealing member to the second re-distribution pattern to expose the second re-distribution pattern.

The electrical connection means may include a solder ball.

The electrical connection means may include at least one first connection pad that contacts the first re-distribution pattern, extends while filling the first via, and is formed on an upper surface of the first sealing member, at least one second connection pad that extends while filling the second via and is formed on a lower surface of the second sealing member, and at least one solder ball interposed between the first connection pad and the second connection pad.

The at least one first semiconductor chip may include a plurality of the first semiconductor chips sequentially stacked, and the first re-distribution pattern may be formed on an upper surface of the uppermost first semiconductor chip. The at least one second semiconductor chip may include a plurality of the second semiconductor chips, and the second re-distribution pattern may be formed on a lower surface of the lowermost second semiconductor chip sequentially stacked. The first re-distribution pattern and the second re-distribution pattern may be disposed to face each other by interposing the electrical connection means therebetween.

An upper surface of the first sealing member and a lower surface of the second sealing member may be disposed separate from each other and to face each other. Also, the upper surface of the first sealing member and the lower surface of the second sealing member may be disposed to contact each other and to face each other.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS OF INVENTIVE CONCEPTS

Example embodiments of inventive concepts will be described more fully with reference to the accompanying drawings.

The inventive concept may, however, be embodied in many different forms and should not be construed as limited to example embodiments of inventive concepts set forth herein. Rather, example embodiments of inventive concepts are provided so that this disclosure will be thorough and complete, and will fully convey the scope of the inventive concept to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "under" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" other elements or features would then be oriented "on" the other elements or features. Thus, the exemplary term "under" can encompass both an orientation of on and under. The device may be otherwise oriented (rotated 90 degrees or at other orientations) and the spatially relative descriptors used herein interpreted accordingly.

The terminology used herein is for the purpose of describing example embodiments of inventive concepts only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
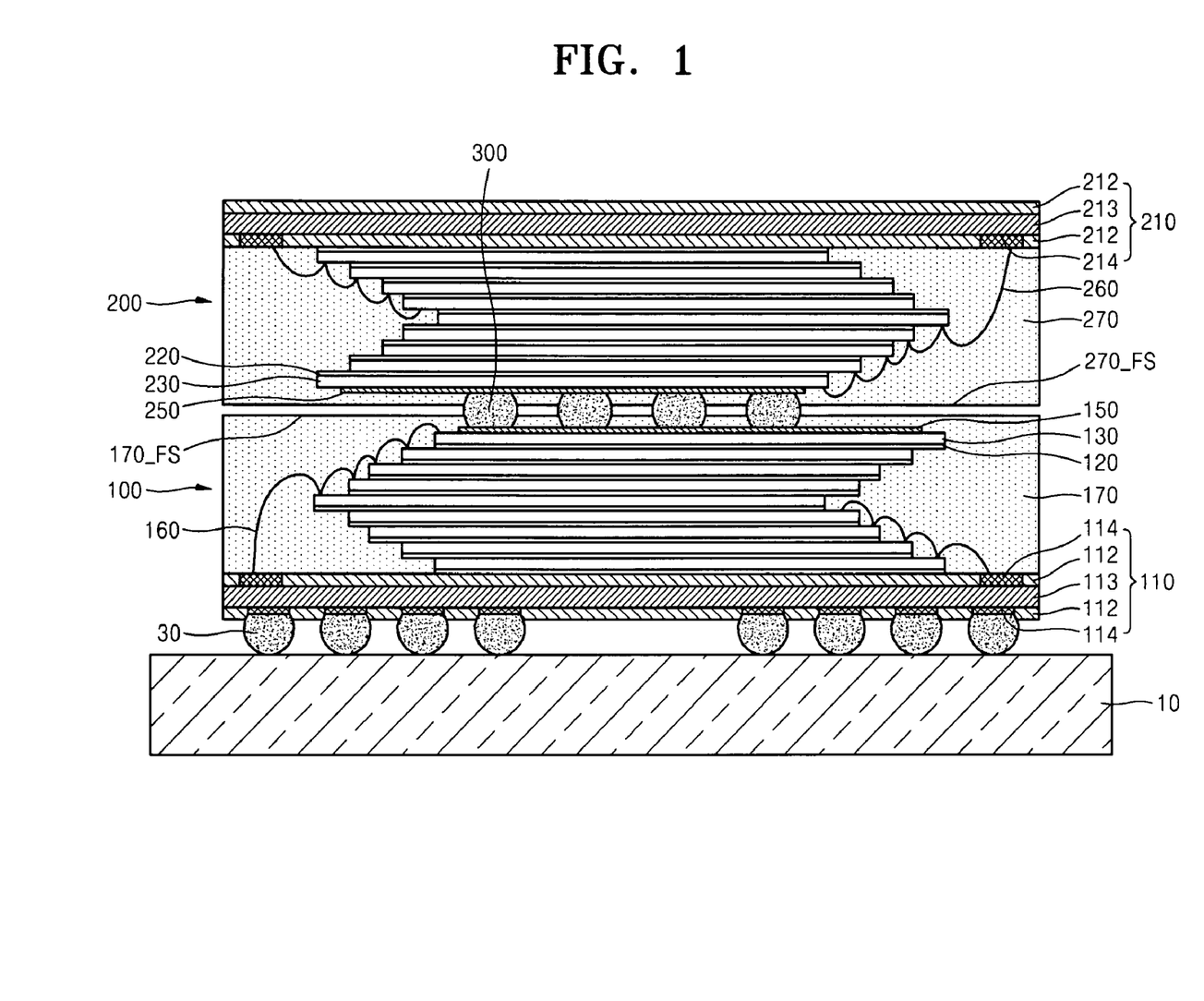
FIG. 1 is a cross-sectional view of a stacked semiconductor package according to example embodiments of inventive concepts.

FIG. 1 is a cross-sectional view of a stacked semiconductor package according to example embodiments of inventive concepts.

Referring to FIG. 1, the stacked semiconductor package may include a first semiconductor package 100 and a second semiconductor package 200. The second semiconductor package 200 may be stacked on the first semiconductor package 100. The first semiconductor package 100 and the second semiconductor package 200 may perform the same function or may perform functions different from each other. For example, the stacked semiconductor package may be referred to as a package on package (POP) type package. However, example embodiments of inventive concepts are not limited thereto.

The first semiconductor package 100 may include a first substrate 110. The first substrate 110 may be, for example, a printed circuit board (PCB). More specifically, conductive substrate pads 114 may be formed on upper and lower surfaces of a core 113, and an insulating layer 112 may be formed between the conductive substrate pads 114. However, example embodiments of inventive concepts are not limited to one kind of the first substrate 110. For example, the first substrate 110 may be a liquid crystal polymer (LCP) film or a polyimide (PI) film in addition to a PCB.

A plurality of first semiconductor chips 130 may be mounted on the first substrate 110 using, for example, adhesive layers 120. For example, the first semiconductor chips 130 may include a memory chip and/or a logic chip. For example, the first semiconductor chips 130 may include a volatile memory chip and/or a non-volatile memory chip. In addition, each of the first semiconductor chips 130 may be the same kind or a different kind of semiconductor chip. Each of the first semiconductor chips 130 may include a chip pad (not shown) connected to an internal circuit, and the chip pads and the conductive substrate pads 114 may be electrically connected via a wire 160.

A first re-distribution pattern 150 may be formed on one of the first semiconductor chips 130. From among a sequentially stacked plurality of the first semiconductor chips 130, the first re-distribution pattern 150 may be formed on an upper surface of the uppermost first semiconductor chip 130. Referring to the first semiconductor package 100 of FIG. 1, the uppermost first semiconductor chip 130 may correspond to the first semiconductor chip 130 farthest from the first substrate 110. Referring to the first semiconductor package 100 of FIG. 1, the upper surface of the first semiconductor chip 130 may correspond to an active surface of the first semiconductor chip 130 on which electrical circuits of the semiconductor chip are formed.

A first sealing member 170 may be formed on the first substrate 110 to protect the first semiconductor chips 130, the adhesive layers 120, the first re-distribution pattern 150, and the wire 160. The first sealing member 170 may be formed of an insulating resin, for example, an epoxy molding compound (EMC).

The first sealing member 170 may include first vias (for example, T of the first semiconductor package 100 in FIG. 5) to expose portions of the first re-distribution pattern 150. The exposed portions of the first re-distribution pattern 150 may correspond to points to be electrically connected to the second semiconductor package 200 by an electrical connection device 300. The first vias may be formed from an upper surface 170_FS of the first sealing member 170 to the first re-distribution pattern 150 to expose portions of the first re-distribution pattern 150.

If the electrical connection device 300 includes solder balls, each of the first vias may have a shape to accommodate at least a portion of one of the solder balls. For example, portions of the solder balls may be disposed to completely fill the first vias. Or, portions of the solder balls may be disposed apart from sidewalls of the first vias. If the electrical connection devices 300 are solder balls, each of the first vias may have an upper part wider than a lower part and may have a circular or oval shape.

The second semiconductor package 200 may include a second substrate 210. The second substrate 210 may be, for example, a printed circuit board (PCB). More specifically, conductive substrate patterns 214 may be formed on a lower surface of a core 213, and insulating films 212 may be formed between the conductive substrate patterns 214 and on the core 213. However, example embodiments of inventive concepts are not limited to one kind of the second substrate 210. For example, the second substrate 210 may be a liquid crystal polymer (LCP) film or a polyimide (PI) film in addition to the PCB.

A plurality of second semiconductor chips 230 may be mounted under the second substrate 210 using, for example, adhesive layers 220. For example, the second semiconductor chips 230 may include a memory chip and/or a logic chip. For example, the second semiconductor chips 230 may include a volatile memory chip and/or a non-volatile memory chip. In addition, each of the second semiconductor chips 230 may be the same kind or a different kind of semiconductor chip. Each of the second semiconductor chips 230 may include a chip pad (not shown) connected to an internal circuit, and the chip pads and the substrate pads 214 may be electrically connected via a wire 260.

A second re-distribution pattern 250 may be formed under one of the second semiconductor chips 230. From among a sequentially stacked plurality of the second semiconductor chips 230, the second re-distribution pattern 250 may be formed on a lower surface of the lowermost second semiconductor chip 230. Referring to the second semiconductor package 200 of FIG. 1, the lowermost second semiconductor chip 230 may correspond to the second semiconductor chip 230 farthest from the second substrate 210. Referring to the second semiconductor chip 230 of FIG. 1, the lower surface of the second semiconductor chip 230 may correspond to an active surface of the second semiconductor chip 230 on which electrical circuits of the semiconductor chip are formed.

A second sealing member 270 may be formed under the second substrate 210 to protect the second semiconductor chips 230, the adhesive layers 220, the second re-distribution pattern 250, and the wire 260. The second sealing member 270 may be formed of an insulating resin, for example, an epoxy molding compound (EMC).

Figure 5:
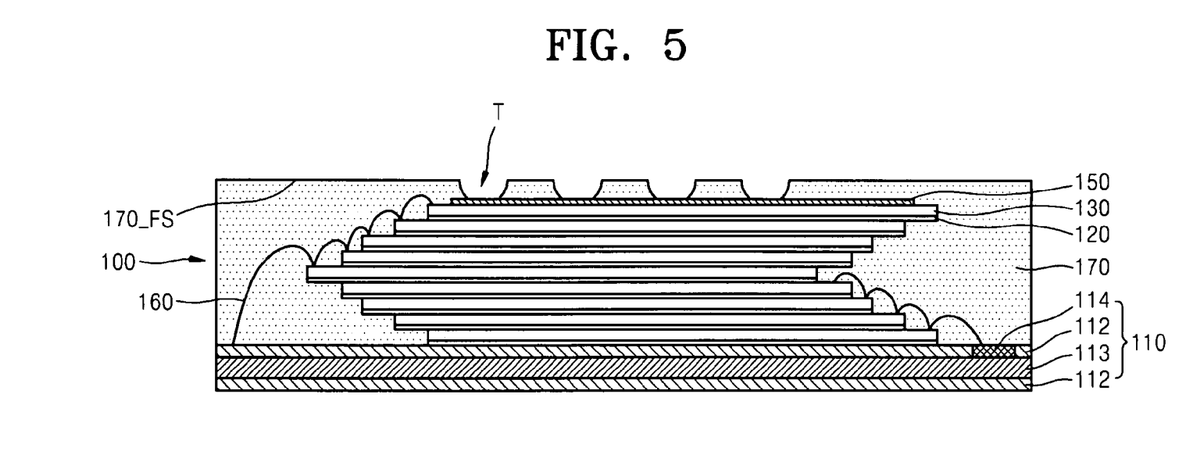

The second sealing member 270 may include second vias (for example, refer to T of the first semiconductor package 100 in FIG. 5) to expose portions of the second re-distribution pattern 250. The exposed portions of the second re-distribution pattern 250 may correspond to points to be electrically connected to the first semiconductor package 100 by the electrical connection device 300. The second via may be formed from a lower surface 270_FS of the second sealing member 270 to the second re-distribution pattern 250 to expose portions of the second re-distribution pattern 250.

If the electrical connection device 300 includes solder balls, each of the second vias may have a shape to accommodate at least a portion of one of the solder balls. For example, another portion of the solder balls may be disposed to completely fill the second vias. Or, another portion of the solder balls may be disposed apart from sidewalls of one of the second vias. If the electrical connection device 300 includes solder balls, each of the second vias may have a lower part wider than an upper part and may have a circular or oval shape.

The electrical connection device 300 may be disposed to be inserted into the first vias and the second vias. For example, a portion of the electrical connection device 300 may be disposed to completely fill the first vias or to be separated from the sidewalls of the first vias. Also, a portion of the electrical connection device 300 may be disposed to completely fill the second vias or to be separated from the sidewalls of the second vias. For example, the structure in FIG. 1 shows that portions of the electrical connection device 300 are disposed to completely fill the first and second vias.

The electrical connection device 300 may be directly connected to the first re-distribution pattern 150 and the second re-distribution pattern 250 to electrically and/or mechanically connect the first semiconductor package 100 and the second semiconductor package 200.

According to example embodiments of inventive concepts, the electrical connection device 300 may include solder balls. The solder balls may have a circular or oval shape. However, the solder balls according example embodiments of inventive concepts is not limited thereto and may have any shape. The smaller the size of the solder balls, the lower the height of a semiconductor package, and thus a semiconductor package having a low height (a low profile POP) may be realized.

The first semiconductor package 100 on which the second semiconductor package 200 is stacked may be electrically connected to a main substrate 10 by interposing solder balls 30 therebetween.

In a stacked semiconductor package according to example embodiments of inventive concepts, the first semiconductor package 100 and the second semiconductor package 200 may be the same size (for example, a cross-sectional area and height) and/or the same type, or may not be the same as necessary. Also, elements (for example, a substrate, and/or a semiconductor chip) that constitute the first semiconductor package 100 and elements (for example, a substrate and/or a semiconductor chip) that constitute the second semiconductor package 200 may be the same size and/or the same type, or may not be the same as necessary.

In a stacked semiconductor package according to example embodiments of inventive concepts, the second semiconductor package 200 may be disposed on the first semiconductor package 100 by being flipped onto the first semiconductor package 100 as shown in FIG. 1, and thus the upper surface 170_FS of the first sealing member 170 and the lower surface 270_FS of the second sealing member 270 may be disposed to face each other. For example, in example embodiments of inventive concepts, as shown in FIG. 1, the upper surface 170_FS of the first sealing member 170 and the lower surface 270_FS of the second sealing member 270 may be disposed separate from each other and to face each other. However, example embodiments of inventive concepts are not limited thereto, and the upper surface 170_FS of the first sealing member 170 and the lower surface 270_FS of the second sealing member 270 may be disposed to contact each other and to face each other according to the size, shape, and/or structure of the electrical connection device 300.

The first re-distribution pattern 150 and the second re-distribution pattern 250, which may be connected by the electrical connection device 300, may be formed of conductive materials. Thus, the thermal expansion coefficient of the first re-distribution pattern 150 and that of the second re-distribution pattern 250 may not be greatly different from each other. The first re-distribution pattern 150 and the second re-distribution pattern 250 may be formed of a conductive material having about the same thermal expansion coefficient.

Regardless of the thermal expansion coefficients of the first and second re-distribution patterns 150 and 250, the first semiconductor chip 130 and the second semiconductor chip 230 may be formed of a material having about the same thermal expansion coefficient.

That is, according to example embodiments of inventive concepts, because the thermal expansion coefficients of the elements of the first and second semiconductor packages 100 and 200, which may be connected to each other via the electrical connection device 300, may not be greatly different, the mechanical reliability of the first and second semiconductor packages 100 and 200 may be increased.

Figure 2:
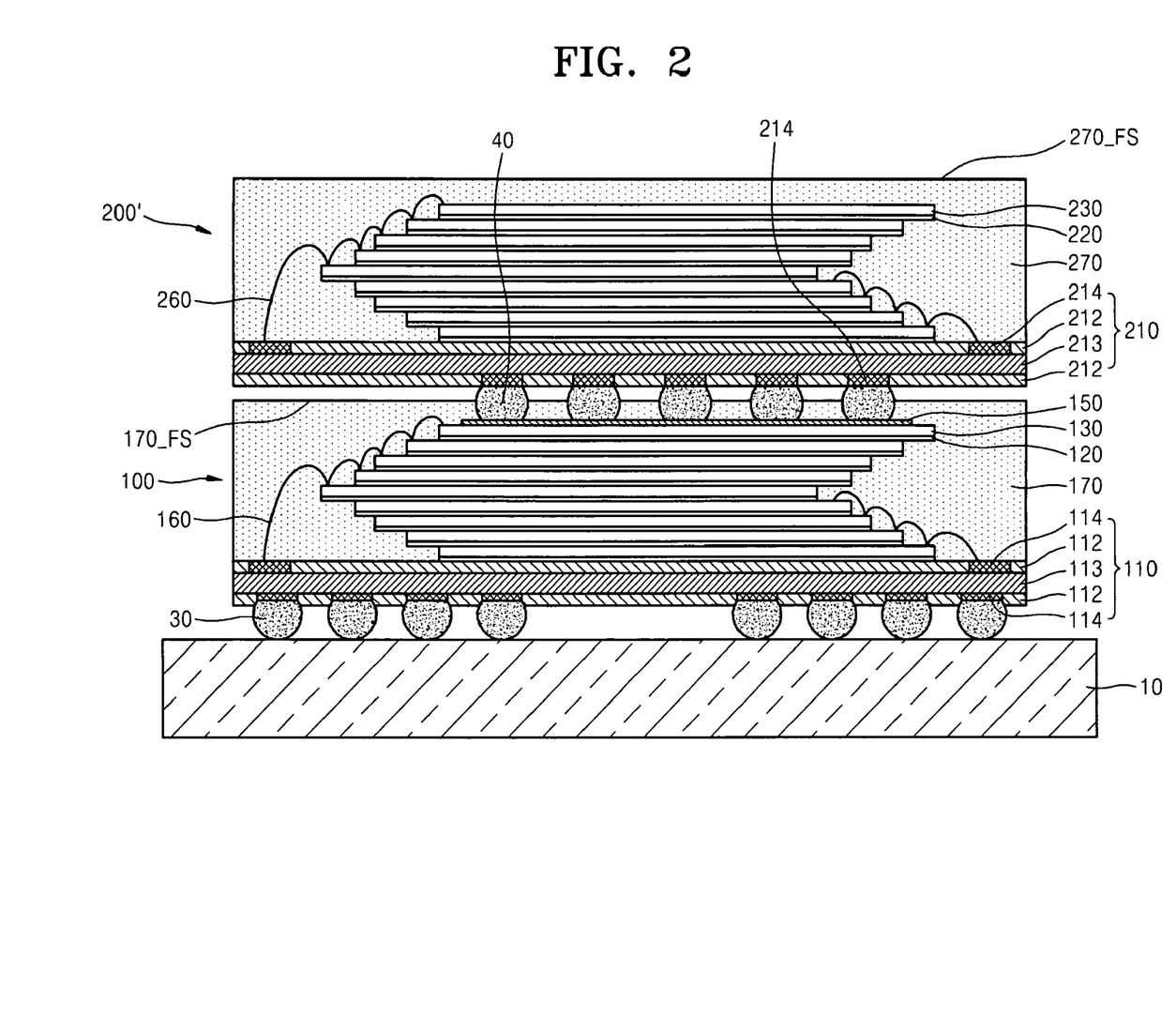
FIG. 2 is a cross-sectional view of a stacked semiconductor package according to example embodiments of inventive concepts.

FIG. 2 is a cross-sectional view of a stacked semiconductor package according to example embodiments of inventive concepts. Like reference numerals in FIG. 2 denote the same elements as in FIG. 1, and thus their descriptions will not be repeated.

Referring to FIG. 2, a second semiconductor package 200' may be stacked on the first semiconductor packages 100. However, the second semiconductor package 200' may differ from the second semiconductor package 200 in that the second semiconductor package 200 stacked on a first semiconductor package 100 in FIG. 1 is flipped over in FIG. 2. In addition, a feature different from the second semiconductor package 200 in FIG. 1 is that a re-distribution pattern is not formed on a second semiconductor chip 230 in the second semiconductor package 200'. Also, a via is not formed in a second sealing member 270 in the second semiconductor package 200'.

Thus, an electrical connection device 40 that electrically connects the first semiconductor package 100 to the second semiconductor package 200' may directly connect the first re-distribution pattern 150 to a second substrate 210 of the second semiconductor package 200'.

The first re-distribution pattern 150 is formed of a conductive material. The second substrate 210 may be, for example, a PCB. More specifically, conductive substrate pads 214 may be formed on upper and lower surfaces of a core 213, and insulating layers 212 may be interposed between the conductive substrate pads 214.

Accordingly, because the first re-distribution pattern 150 may have a thermal coefficient greatly different from that of the second substrate 210, when an external thermal load is applied to the stacked semiconductor package, mechanical reliability between the first semiconductor package 100 and the second semiconductor package 200' may be reduced.

Figure 3:
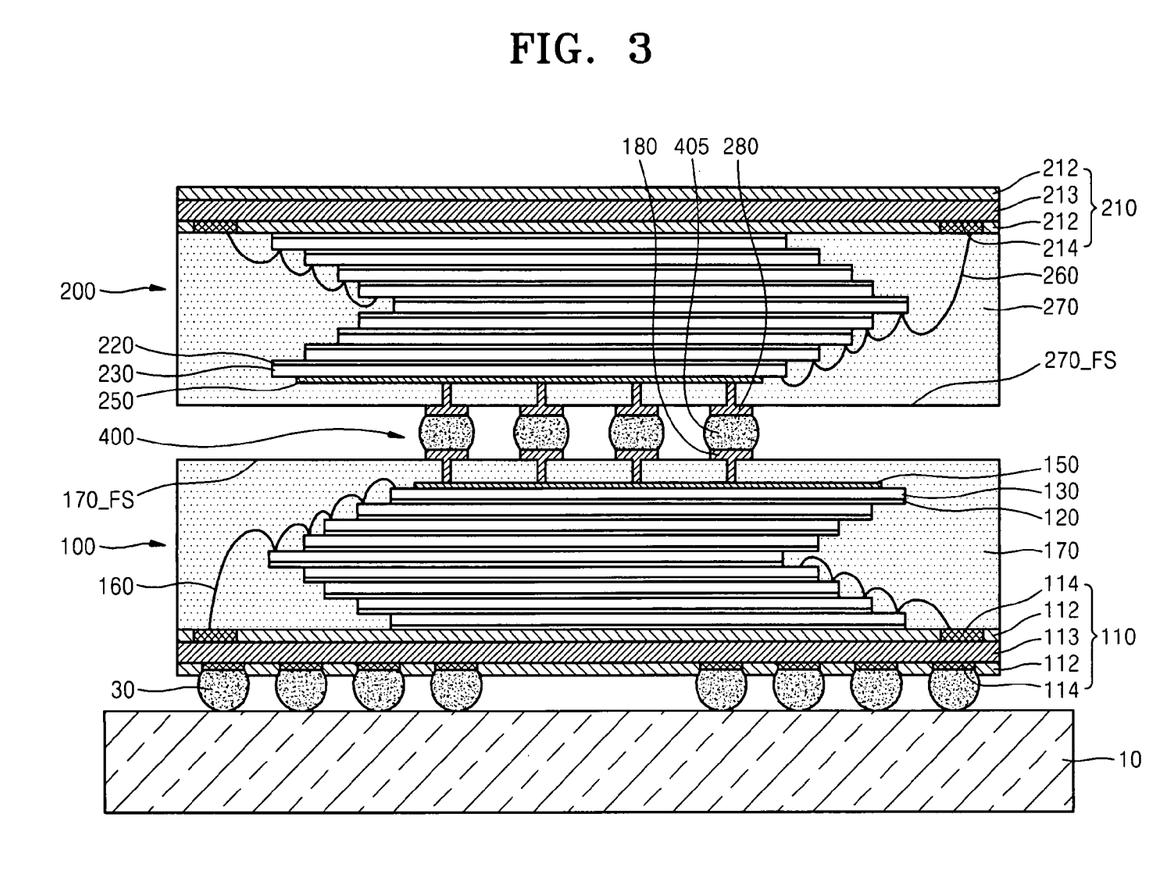
FIG. 3 is a cross-sectional view of a stacked semiconductor package according to example embodiments of inventive concepts.

FIG. 3 is a cross-sectional view of a stacked semiconductor package according to example embodiments of inventive concepts.

Referring to FIG. 3, the stacked semiconductor package according to example embodiments of inventive concepts may include a first semiconductor package 100 and a second semiconductor package 200. The second semiconductor package 200 may be stacked on the first semiconductor package 100. The first semiconductor package 100 and the second semiconductor package 200 may not perform the same function. For example, the stacked semiconductor package may be a POP type package. However, example embodiments of inventive concepts are not limited to the terminology.

The first semiconductor package 100 may include a first substrate 110. The first substrate 110 may be, for example, PCB. More specifically, conductive substrate pads 114 may be formed on upper and lower surfaces of a core 113, and insulating layers 112 may be interposed between the conductive substrate pads 114. However, example embodiments of inventive concepts are not limited to one kind of the first substrate 110. For example, the first substrate 110 may be a liquid crystal polymer (LCP) film or a polyimide (PI) film in addition to the PCB.

A plurality of first semiconductor chips 130 may be mounted on the first substrate 110 using, for example, adhesive layers 120. For example, the first semiconductor chip 130 may include a memory chip and/or a logic chip. For example, the first semiconductor chips 130 may include a volatile memory chip and/or a non-volatile memory chip. In addition, each of the first semiconductor chips 130 may be the same kind or a different kind of semiconductor chip. Each of the first semiconductor chips 130 may include a chip pad (not shown) connected to an internal circuit, and the chip pads and the conductive substrate pads 114 may be electrically connected via a wire 160.

A first re-distribution pattern 150 may be formed on one of the first semiconductor chips 130. From among a sequentially stacked plurality of the first semiconductor chips 130, the first re-distribution pattern 150 may be formed on an upper surface of the uppermost first semiconductor chip 130. Referring to the first semiconductor package 100 of FIG. 1, the uppermost first semiconductor chip 130 corresponds to the first semiconductor chip 130 farthest from the first substrate 110. Referring to the first semiconductor package 100 of FIG. 3, the upper surface of the first semiconductor chip 130 may correspond to an active surface of the first semiconductor chip 130 on which electrical circuits of the semiconductor chip are formed.

A first sealing member 170 may be formed on the first substrate 110 to protect the first semiconductor chips 130, the adhesive layers 120, the first re-distribution pattern 150, and the wire 160. The first sealing member 170 may be formed of an insulating resin, for example, an epoxy molding compound (EMC).

The first sealing member 170 may include first vias (for example, T' of the first semiconductor package 100 in FIG. 9) to expose portions of the first re-distribution pattern 150. The exposed portions of the first re-distribution pattern 150 may correspond to points to be electrically connected to the second semiconductor package 200 by electrical connection device 400. The first vias may be formed from an upper surface 170_FS of the first sealing member 170 to the first re-distribution pattern 150 to expose portions of the first re-distribution pattern 150.

A first connection pattern 180 that contacts the first re-distribution pattern 150 may be formed on the upper surface 170_FS of the first sealing member 170. The first connection pattern 180 may contact the first re-distribution pattern 150 and extend to the upper surface 170_FS of the first sealing member 170 while filling the first vias.

The second semiconductor package 200 may include a second substrate 210. The second substrate 210 may be, for example, a printed circuit board (PCB). More specifically, conductive substrate patterns 214 may be formed on a lower surface of a core 213, and insulating films 212 may be formed between the conductive substrate patterns 214 and on the core 213. However, example embodiments of inventive concepts are not limited to one kind of the second substrate 210. For example, the second substrate 210 may be a liquid crystal polymer (LCP) film or a polyimide (PI) film in addition to the PCB.

A plurality of second semiconductor chips 230 may be mounted under the second substrate 210 using, for example, adhesive layers 220. For example, the second semiconductor chips 230 may include a memory chip and/or a logic chip. For example, the second semiconductor chips 230 may include a volatile memory chip and/or a non-volatile memory chip. In addition, each of the second semiconductor chips 230 may be the same kind or a different kind of semiconductor chip. The second semiconductor chip 230 may include a chip pad (not shown) connected to an internal circuit, and the chip pad and the conductive substrate pad 214 may be electrically connected via a wire 260.

A second re-distribution pattern 250 may be formed under one of the second semiconductor chips 230. From among a sequentially stacked plurality of the second semiconductor chips 230, the second re-distribution pattern 250 may be formed on a lower surface of the lowermost second semiconductor chip 230. Referring to the second semiconductor package 200 of FIG. 3, the lowermost second semiconductor chip 230 corresponds to the farthest second semiconductor chip 230 from the second substrate 210. Referring to the second semiconductor chip 230 of FIG. 3, the lower surface of the second semiconductor chip 230 may correspond to an active surface of the second semiconductor chip 230 on which electrical circuits of the semiconductor chip are formed.

A second sealing member 270 may be formed under the second substrate 210 to protect the second semiconductor chips 230, the adhesive layers 220, the second re-distribution pattern 250, and the wire 260. The second sealing member 270 may be formed of an insulating resin, for example, an epoxy molding compound (EMC).

Figure 9:
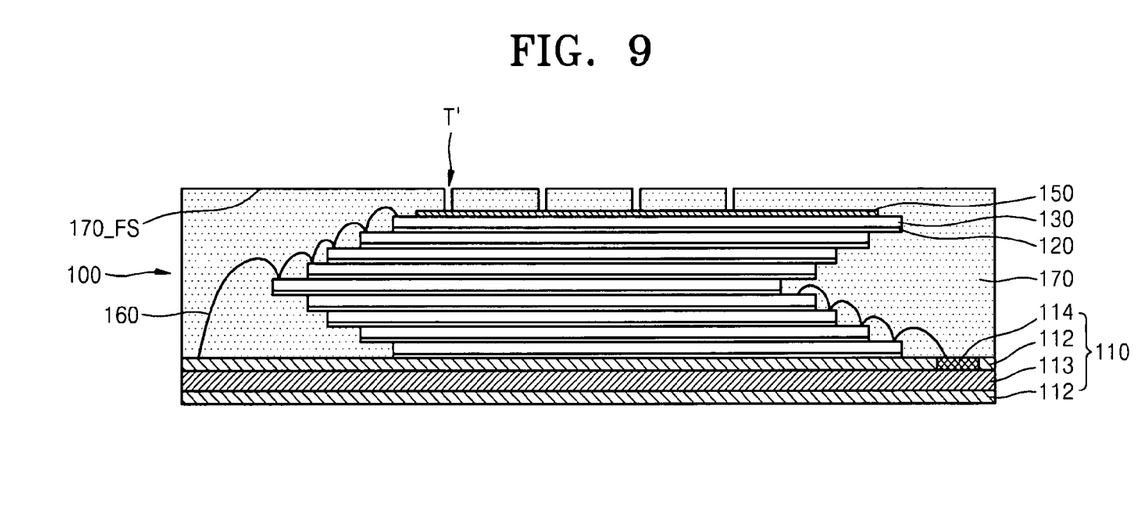

The second sealing member 270 may include second vias (for example, refer to T' of the first semiconductor package 100 in FIG. 9) to expose portions of the second re-distribution pattern 250. The exposed portions of the second re-distribution pattern 250 may correspond to points to be electrically connected to the first semiconductor package 100 by the electrical connection device 400. The second vias may be formed from a lower surface 270_FS of the second sealing member 270 to the second re-distribution pattern 250 to expose portions of the second re-distribution pattern 250.

A plurality of second connection pads 280 that contact the second re-distribution pattern 250 is formed on the lower surface 270_FS of the second sealing member 270. The second connection pads 280 contact the second re-distribution pattern 250 and extend to the lower surface 270_FS of the second sealing member 270 while filling the second vias.

A plurality of solder balls 405 may be formed between the first connection pads 180 and the second connection pads 280. In example embodiments of inventive concepts, an electrical connection means 400 that may connect the first semiconductor package 100 and the second semiconductor package 200 may include the first connection pads 180, the second connection pads 280, and the solder balls 405. The solder balls 405 may have a circular and/or oval shape. However, the shape of the solder balls 405 according to example embodiments of inventive concepts is not limited thereto. The smaller the size of the solder balls, the lower the height of a semiconductor package, and thus a semiconductor package having a low height (a low profile POP) can be realized.

According to example embodiments of inventive concepts, the solder balls 405 may be replaced by stud bumps.

The first connection pads 180 and the second connection pads 280 may be directly connected to each other without interposing the solder balls 405 therebetween. In example embodiments of inventive concepts, the electrical connection means 400 that may electrically connect the first semiconductor package 100 and the second semiconductor package 200 may include the first connection pads 180 and the second connection pads 280.

In a stacked semiconductor package according to example embodiments of inventive concepts, the first semiconductor package 100 and the second semiconductor package 200 may not be the same size (for example, cross-sectional area and height) and/or may not be the same type. Also, elements (for example, substrate and/or semiconductor chips) that constitute the first semiconductor package 100 and elements (for example, substrate and/or semiconductor chip) that constitute the second semiconductor package 200 may not be the same size and/or may not be the same type as necessary.

In a stacked semiconductor package according to example embodiments of inventive concepts, the second semiconductor package 200 may be disposed on the first semiconductor package 100 by being flipped onto the first semiconductor package 100 as shown in FIG. 3, and thus the upper surface 170_FS of the first sealing member 170 and the lower surface 270_FS of the second sealing member 270 may be disposed to face each other. For example, in example embodiments of inventive concepts, as shown in FIG. 1, the upper surface 170_FS of the first sealing member 170 and the lower surface 270_FS of the second sealing member 270 may be disposed separate from each other and to face each other.

The first re-distribution pattern 150 and the second re-distribution pattern 250, which may be connected to each other by the electrical connection means 400, may be formed of conductive materials. Thus, the thermal expansion coefficient of the first re-distribution pattern 150 and that of the second re-distribution pattern 250 may not be greatly different from each other. The first re-distribution pattern 150 and the second re-distribution pattern 250 may be formed of a conductive material having about the same thermal expansion coefficient.

Regardless of the thermal expansion coefficients of the first and second re-distribution patterns 150 and 250, the first semiconductor chip 130 and the second semiconductor chip 230 may be formed of a material having about the same thermal expansion coefficient.

That is, according to example embodiments of inventive concepts, since the thermal expansion coefficients of the elements of the first and second semiconductor packages 100 and 200, which may be connected to each other via the electrical connection device 400, may not be greatly different, the mechanical reliability of the first and second semiconductor packages 100 and 200 may be increased.

FIGS. 4 through 7 are cross-sectional views sequentially illustrating a method of manufacturing the stacked semiconductor package of FIG. 1, according to example embodiments of inventive concepts. Like reference numerals are used to indicate elements of FIGS. 4 through 7 to the elements of FIG. 1, and thus the detailed description thereof will not be repeated.

Figure 4:
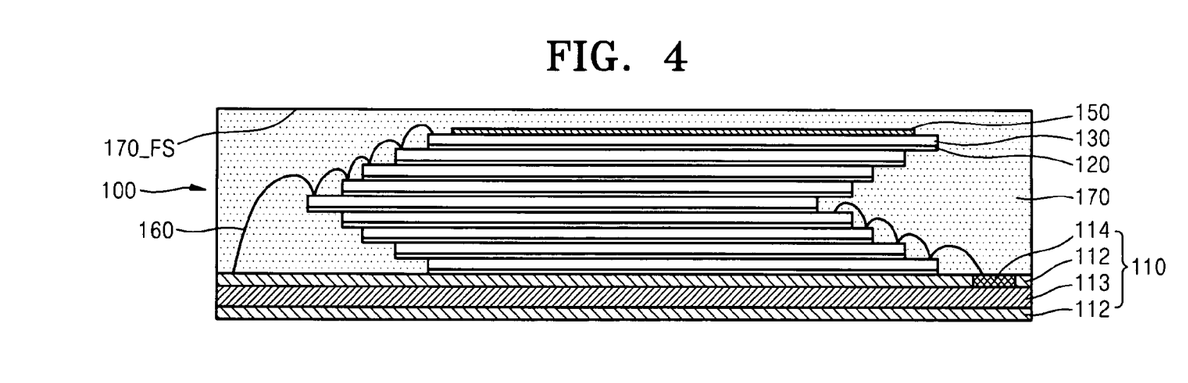
FIGS. 4 through 7 are cross-sectional views sequentially illustrating a method of manufacturing the stacked semiconductor package of FIG. 1, according to example embodiments of inventive concepts.

Referring to FIG. 4, a first semiconductor package 100 may be formed.

A first sealing member 170 may be formed on a first substrate 110 to protect a plurality of first semiconductor chips 130, a plurality of adhesive layers 120, a first re-distribution pattern 150, and a wire 160. The first sealing member 170 may be formed of an insulating resin, for example, an epoxy molding compound (EMC).

Referring to FIG. 5, first vias T may be formed.

The first sealing member 170 may include the first vias T to expose portions of the first re-distribution pattern 150. The exposed portions of the first re-distribution pattern 150 may correspond to points to be electrically connected to a second semiconductor package 200 in a subsequent process by an electrical connection device 300. The first vias may be formed from an upper surface 170_FS of the first sealing member 170 to the first re-distribution pattern 150 to expose portions of the first re-distribution pattern 150.

If the electrical connection device 300 includes solder balls, each of the first vias may have a shape to accommodate at least a portion of one of the solder balls. For example, a portion of the solder balls may be disposed to completely fill the first vias. Or, a portion of the solder balls may be disposed apart from sidewalls of the first vias. If the electrical connection device 300 includes solder balls, each of the first vias may have an upper part wider than a lower part and may have a circular or oval shape.

Figure 6:
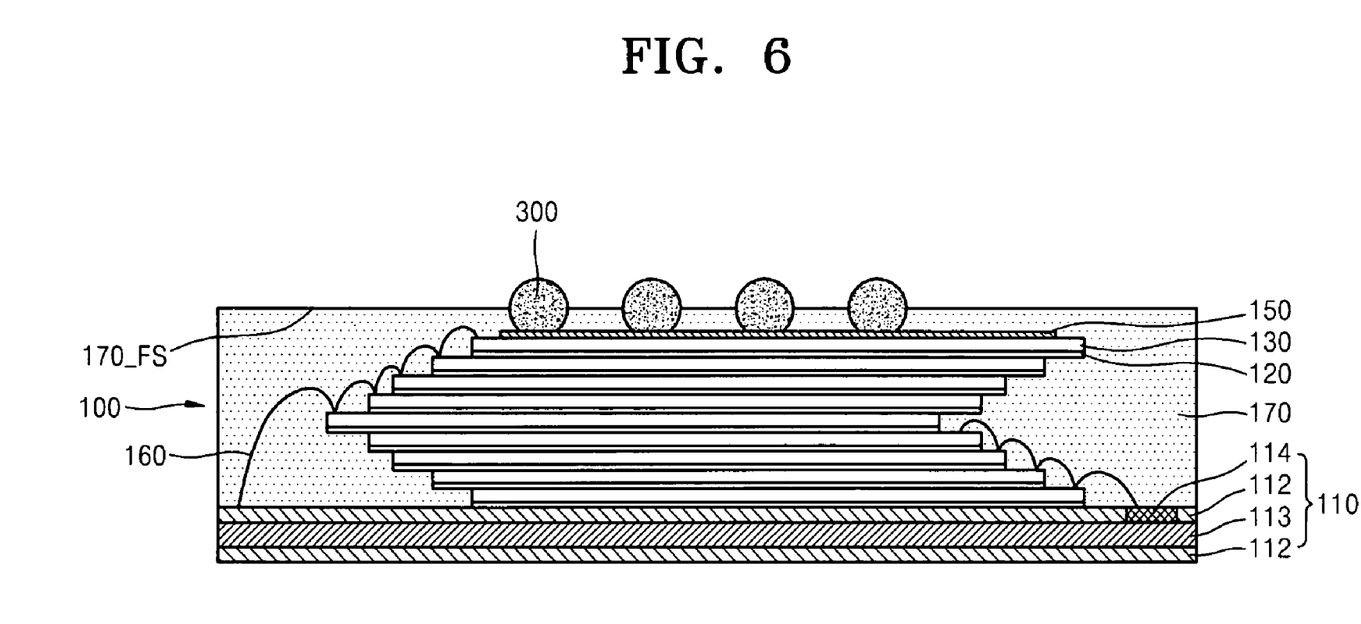

Referring to FIG. 6, the electrical connection device 300 that may fill the first vias T may be formed. The electrical connection device 300 may include, for example, solder balls. The solder balls may have a circular and/or oval shape. However, the shape of the solder balls according to example embodiments of inventive concepts is not limited thereto. The smaller the size of the solder balls, the lower the height of a semiconductor package, and thus a semiconductor package having a low height (a low profile POP) may be realized. According to example embodiments of inventive concepts, the solder balls may be replaced by stud bumps.

Figure 7:
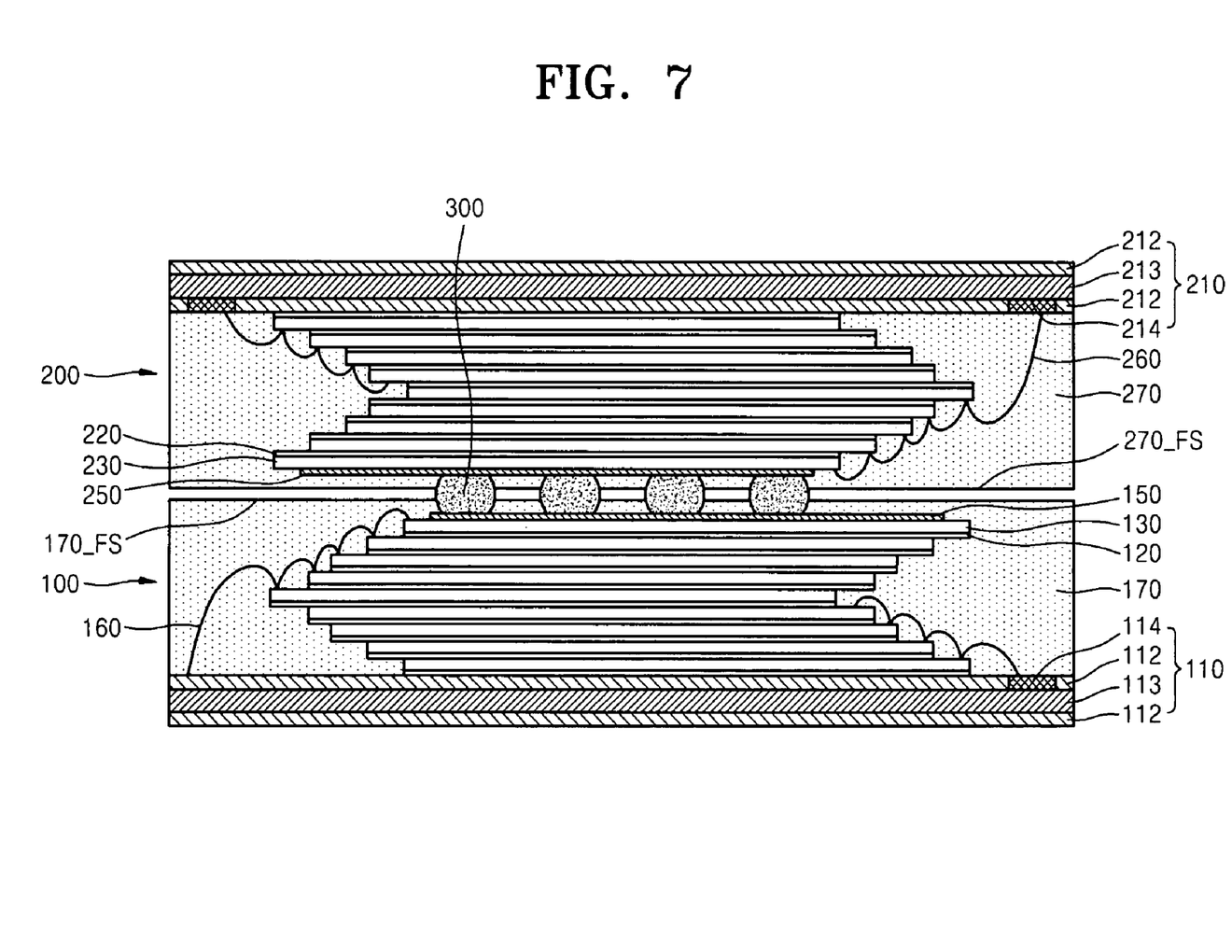

Referring to FIG. 7, the second semiconductor package 200 may be stacked on the first semiconductor package 100. The process of preparing the second semiconductor package 200 may be the same as the process of preparing the first semiconductor package 100 described with reference to FIGS. 4 and 5.

The second semiconductor package 200 may be flipped over and may be stacked on the first semiconductor package 100. Accordingly, the first re-distribution pattern 150 of the first semiconductor package 100 and the second re-distribution pattern 250 of the second semiconductor package 200 may be electrically connected to each other by the electrical connection device 300.

According to example embodiments of inventive concepts, the electrical connection device 300, which may be formed to fill the first vias T of the first semiconductor package 100 and the second vias T of the second semiconductor package 200, may be performed after disposing the first semiconductor package 100 and the second semiconductor package 200 to face each other.

FIGS. 8 through 12 are cross-sectional views sequentially illustrating a method of manufacturing the stacked semiconductor package of FIG. 3, according to example embodiments of inventive concepts. Like reference numerals in FIGS. 8 through 12 denote the same elements as in FIG. 3, and thus their descriptions will not be repeated.

Figure 8:
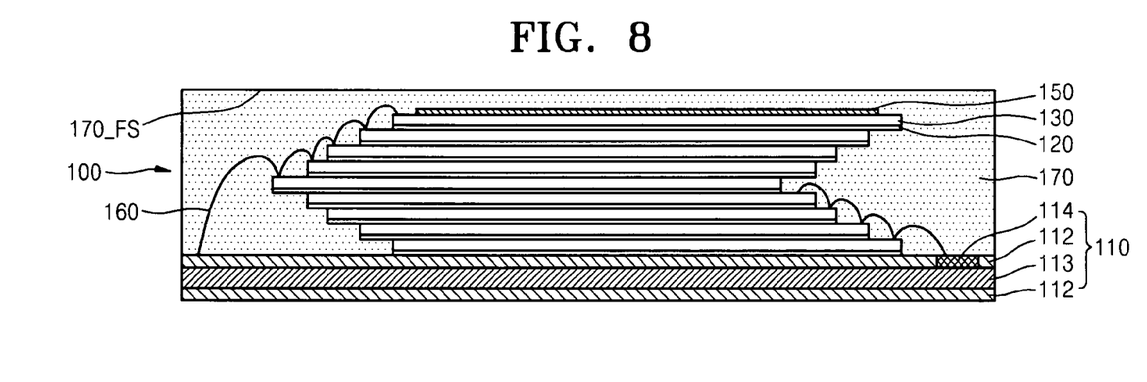
FIGS. 8 through 12 are cross-sectional views sequentially illustrating a method of manufacturing the stacked semiconductor package of FIG. 3, according to example embodiments of inventive concepts.

Referring to FIG. 8, a first semiconductor package 100 may be formed.

A first sealing member 170 may be formed on a first substrate 110 to protect a plurality of first semiconductor chips 130, a plurality of adhesive layers 120, a first re-distribution pattern 150, and a wire 160. The first sealing member 170 may be formed of an insulating resin, for example, an EMC.

Referring to FIG. 9, first vias T' may be formed.

The first sealing member 170 may include the first vias T' to expose portions of the first re-distribution pattern 150. The exposed portions of the first re-distribution pattern 150 may correspond to points to be electrically connected to a second semiconductor package 200 in a subsequent process by an electrical connection device. The first vias may be formed from an upper surface 170_FS of the first sealing member 170 to the first re-distribution pattern 150 to expose portions of the first re-distribution pattern 150.

The first vias T' may be formed to vertically perforate the first sealing member 170 from an upper surface 170_FS of the first sealing member 170 to the first re-distribution pattern 150.

Figure 10:
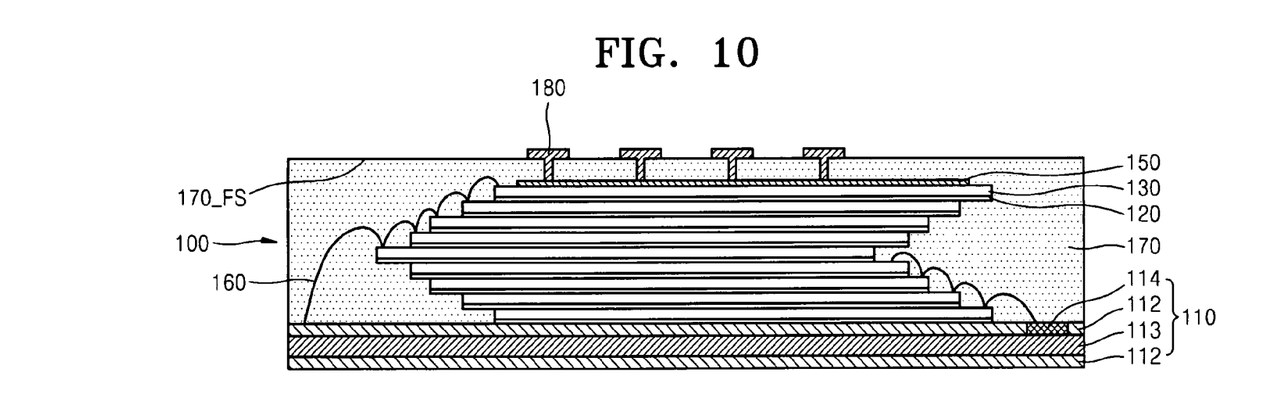

Referring to FIG. 10, first connection pads 180 may fill the first vias T' and may be are formed on the upper surface 170_FS of the first sealing member 170. The first connection pads 180 may contact the first re-distribution pattern 150 and may extend on the upper surface 170_FS of the first sealing member 170 while filling the first vias T'.

Figure 11:
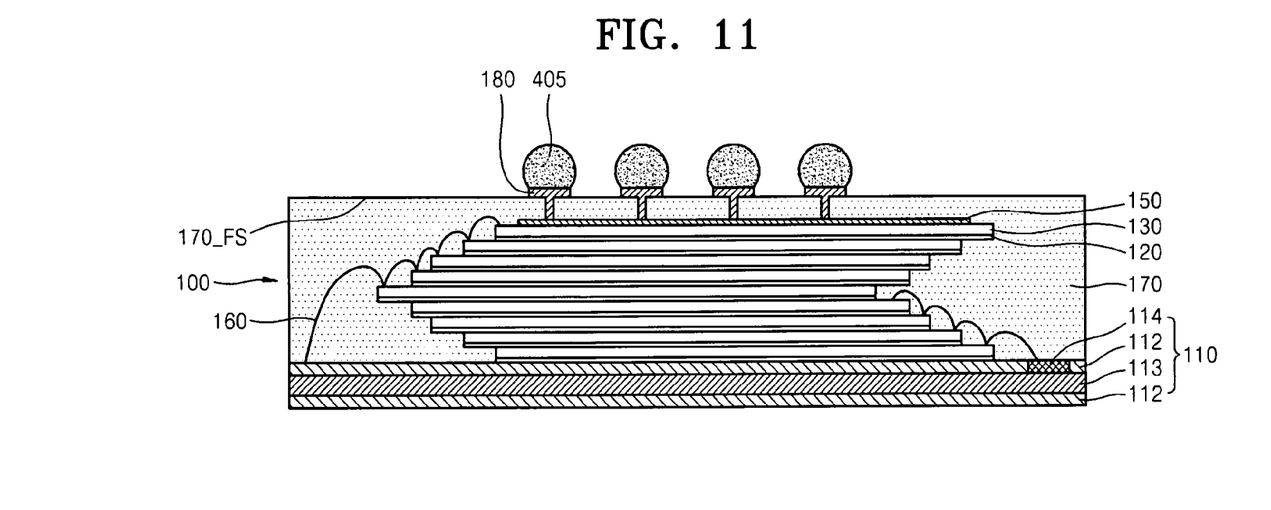

Referring to FIG. 11, solder balls 405 may be formed on the first vias T'. The solder balls 405 may have a circular and/or oval shape. However, the shape of the solder balls 405 according to example embodiments of inventive concepts is not limited thereto. The smaller the size of the solder balls, the lower the height of a semiconductor package, and thus a semiconductor package having a low height (a low profile POP) may be realized.

According to example embodiments of inventive concepts, the solder balls 405 may be replaced by stud bumps.

Figure 12:
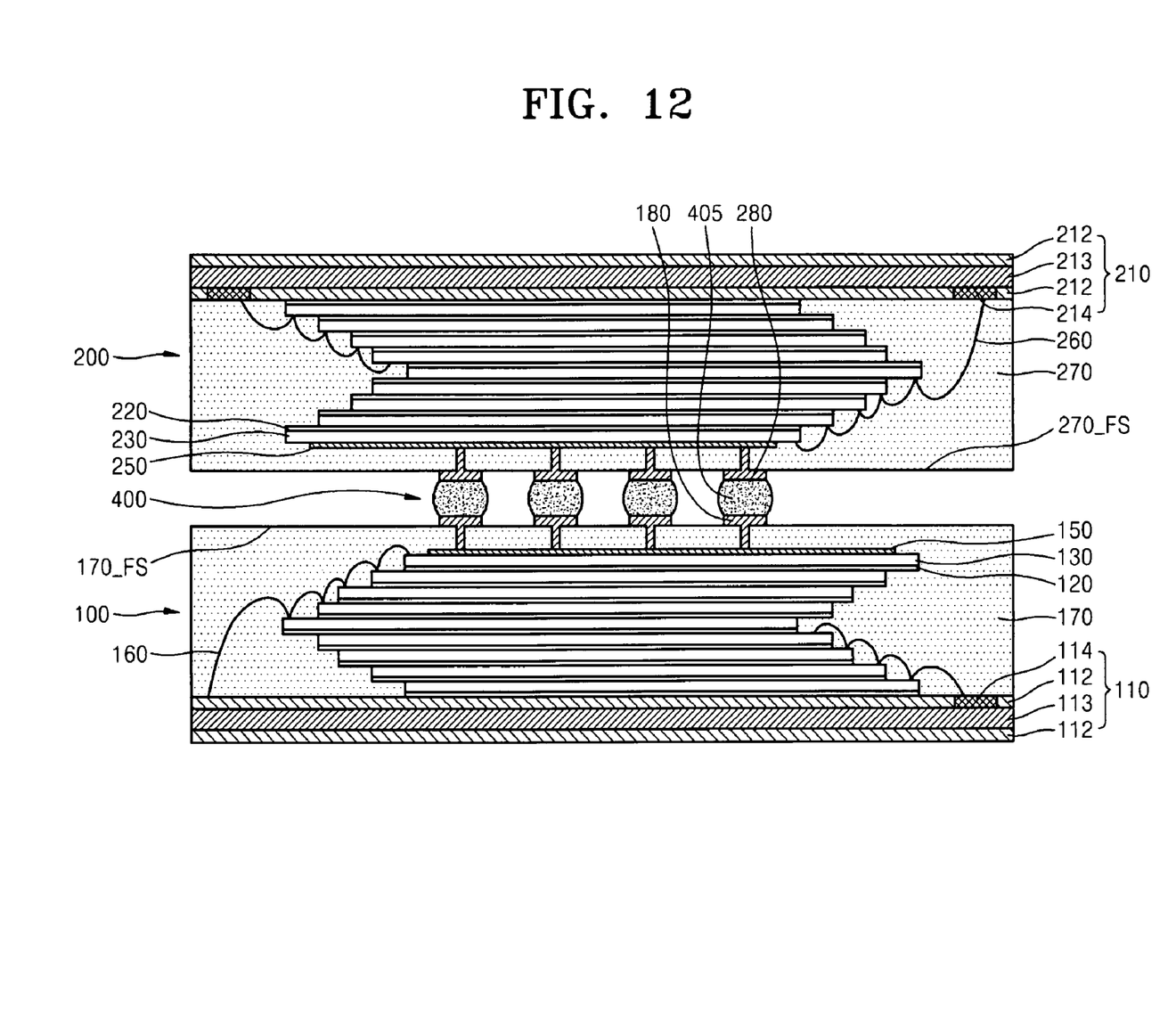

Referring to FIG. 12, the second semiconductor package 200 may be stacked on the first semiconductor package 100. The process of preparing the second semiconductor package 200 may be the same as the process of preparing the first semiconductor package 100 described with reference to FIGS. 8 through 10.

The second semiconductor package 200 may be flipped over and may be stacked on the first semiconductor package 100. Accordingly, the first re-distribution pattern 150 of the first semiconductor package 100 and the second re-distribution pattern 250 of the second semiconductor package 200 may be electrically connected to each other by an electrical connection device 400. The electrical connection device 400 may include the first connection pads 180, the second connection pads 280, and the solder balls 405.

According to example embodiments of inventive concepts, the stacked semiconductor package may be realized by forming the solder balls 405 between the first connection pads 180 and the second connection pads 280 after disposing the first semiconductor package 100 on which the first connection pads 180 may be formed and the second semiconductor package 200 on which the second connection pads 280 may be formed to face each other.

Hereinafter, various application examples will now be described using a stacked semiconductor package according to example embodiments of inventive concepts. Though there are many application examples, only a few of the application examples will be described below.

Figure 13:
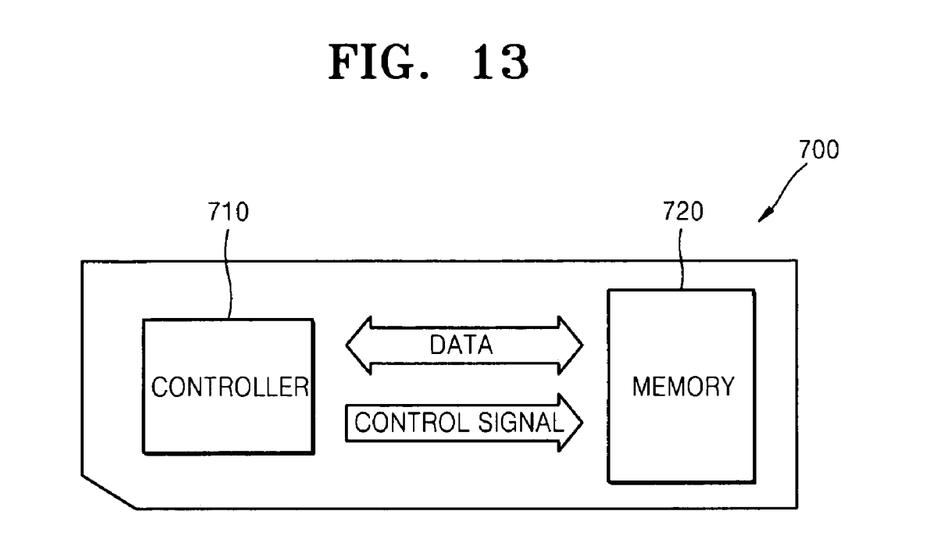
FIG. 13 is a schematic drawing of a card that uses a stacked semiconductor package according to example embodiments of inventive concepts.

FIG. 13 is a schematic drawing of a card 700 that uses a stacked semiconductor package according to example embodiments of inventive concepts.

More specifically, the stacked semiconductor package according to example embodiments of inventive concepts may be applied to the card 700. The card 700 may be a multimedia card (MMC) and a secure digital card (SD). The card 700 may include a controller 710 and a memory 720. The memory 720 may be a flash memory, a phase-change memory (PRAM), or another type non-volatile memory. The controller 710 may transmit a signal to the memory 720, and data may be communicated between the controller 710 and the memory 720.

The controller 710 and the memory 720, which constitute the card 700, may employ the stacked semiconductor package according to example embodiments of inventive concepts. Accordingly, although there may be a relatively high thermal load applied from the outside, a card having a stable performance may be realized.

Figure 14:
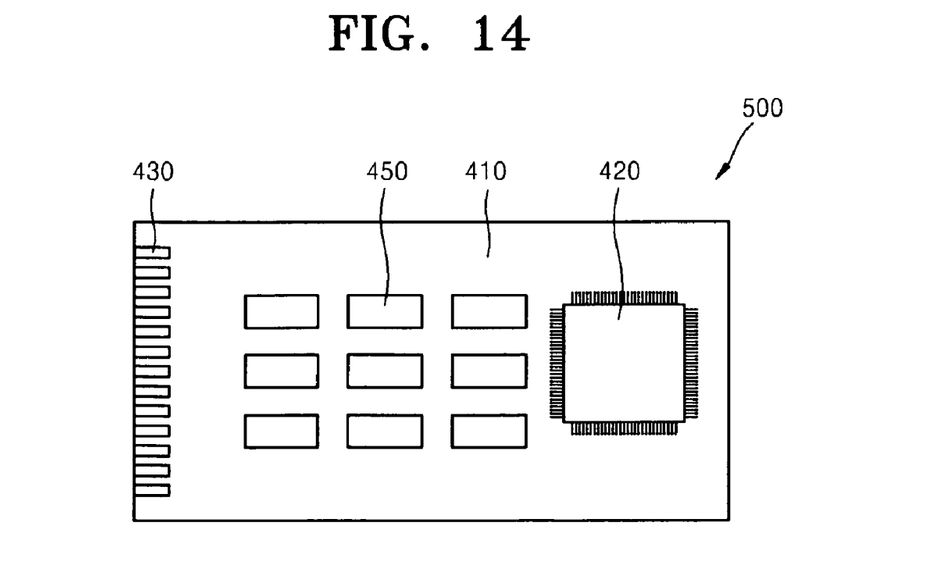
FIG. 14 is a schematic drawing of a package module that uses a stacked semiconductor package according to example embodiments of inventive concepts.

FIG. 14 is a schematic drawing of a package module 500 that uses a stacked semiconductor package according to example embodiments of inventive concepts.

More specifically, a stacked semiconductor package 450 according to example embodiments of inventive concepts may be applied to the package module 500. The package module 500 may include a module substrate 410 on which a plurality of stacked semiconductor packages may be mounted. The package module 500 may include a quad flat package (QFP) type package 420 on a first side thereof and a plurality of external connection terminals 430 on a second side thereof. A stacked semiconductor package according to example embodiments of inventive concepts is not limited to the stacked semiconductor package 450 of FIG. 14, and may be applied to various package modules.

Figure 15:
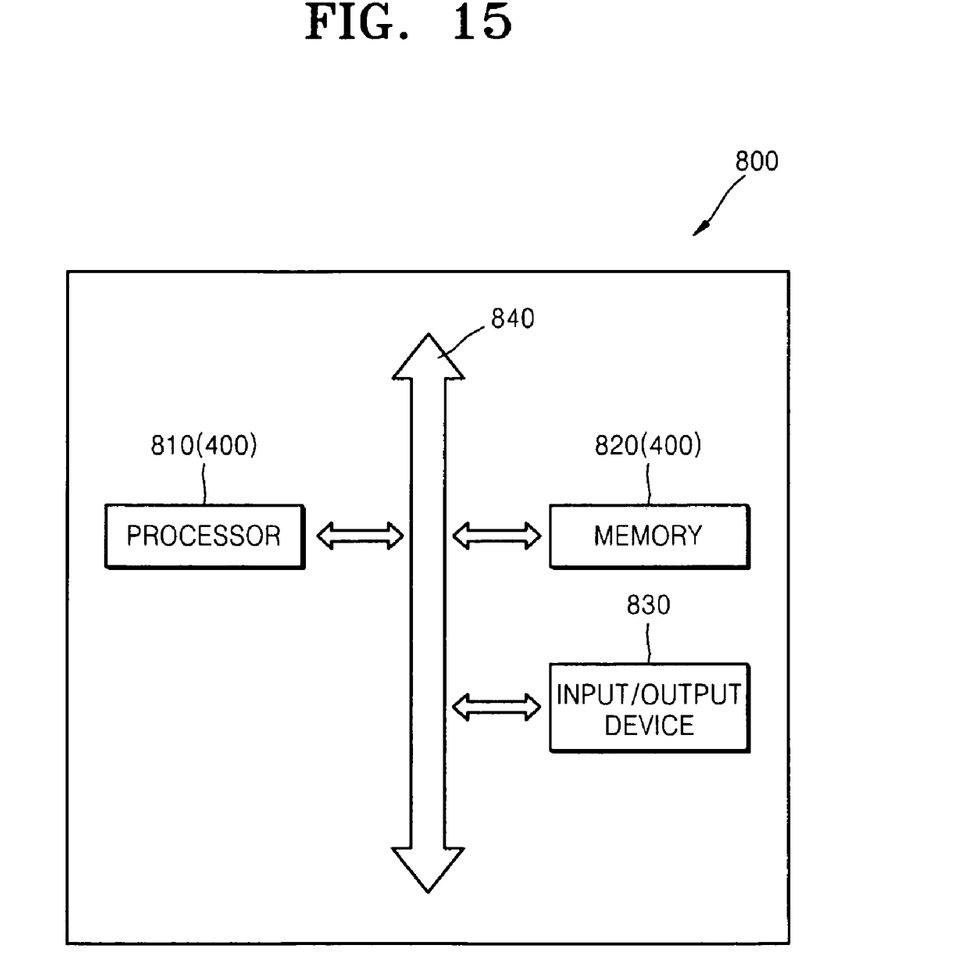
FIG. 15 is a schematic drawing of the structure of an electronic system that uses a stacked semiconductor package according to example embodiments of inventive concepts.

FIG. 15 is a schematic drawing of the structure of an electronic system 800 that uses a stacked semiconductor package according to example embodiments of inventive concepts.

More specifically, the electronic system 800 according to example embodiments of inventive concepts may be, for example, a computer, a mobile phone, an MP3 player, or a navigation device. The electronic system 800 may include a processor 810, a memory 820, and an input/output device 830. A control signal or data may be communicated between the processor 810 and the memory 820 or the input/output device 830 via a communication channel 840.

In the electronic system 800, the stacked semiconductor package according to example embodiments of inventive concepts may be employed as the processor 810 and the memory 820. Accordingly, the electronic system 800 may have increased reliability due to the stacked semiconductor package, which may have a stable performance even if there is a relatively high thermal stress.

While the inventive concept has been particularly shown and described with reference to example embodiments of inventive concepts thereof, it will be understood that various changes in form and details may be made therein without departing from the spirit and scope of the following claims.

What is claimed is:

1. A stacked semiconductor package comprising:
   a first semiconductor package, the first semiconductor package including
      a first substrate,
      at least one first semiconductor chip on the first substrate,
      a first re-distribution pattern on the at least one first semiconductor chip, and
      a first sealing member on the first substrate, the first sealing member covering the at least one first semiconductor chip and having at least one first via exposing the first re-distribution pattern;
   a second semiconductor package on the first semiconductor package, the second semiconductor package including
      a second substrate,
      at least one second semiconductor chip under the second substrate,
      a second re-distribution pattern on the at least one second semiconductor chip, and
      a second sealing member on a lower side of the second substrate, the second sealing member covering the at least one second semiconductor chip and having at least one second via exposing the second re-distribution pattern; and
   at least one electrical connection device electrically connecting the first semiconductor package and the second semiconductor package, wherein the at least one electrical connection device is in the at least one first via and the at least one second via and connects the first re-distribution pattern and the second re-distribution pattern.

2. The stacked semiconductor package of claim 1, wherein the at least one electrical connection device includes a solder ball.

3. The stacked semiconductor package of claim 2, wherein the solder ball directly contacts the first and second re-distribution patterns.

4. The stacked semiconductor package of claim 1, wherein the at least one electrical connection device includes
at least one first connection pad on an upper surface of the first sealing member, the at least one first connection pad extending to the first re-distribution pattern and filling the at least one first via;
at least one second connection pad on a lower surface of the second sealing member, the at least one second connection pad extending to the second re-distribution pattern and filling the at least one second via; and
at least one solder ball between the at least one first connection pad and the at least one second connection pad.

5. The stacked semiconductor package of claim 1, wherein
the at least one first semiconductor chip is a plurality of first stacked semiconductor chips, and the first re-distribution pattern is on an upper surface of an uppermost first semiconductor chip of the plurality of first stacked semiconductor chips, and
the at least one second semiconductor chip is a plurality of stacked second semiconductor chips, and the second re-distribution pattern is on a lower surface of a lowermost second semiconductor chip of the plurality of second stacked semiconductor chips,
wherein the first re-distribution pattern and the second re-distribution pattern are arranged to face each other and the at least one electrical connection device is arranged between the first and second re-distribution patterns.

6. The stacked semiconductor package of claim 1, wherein an upper surface of the first sealing member is arranged to face a lower surface of the second sealing member and the upper surface of the first sealing member and the lower surface of the second sealing member are separate from each other.

7. The stacked semiconductor package of claim 1, wherein an upper surface of the first sealing member is arranged to face and contact a lower surface of the second sealing member.

8. The stacked semiconductor package of claim 1, wherein the first re-distribution pattern and the second re-distribution pattern have about the same thermal expansion coefficients.

9. The stacked semiconductor package of claim 1, wherein the first semiconductor package and the second semiconductor package include materials having about the same thermal expansion coefficients.

10. The stacked semiconductor package of claim 1, wherein
the at least one first via includes a via extending from an upper surface of the first sealing member to the first re-distribution pattern to expose a portion of the first re-distribution pattern, and
the at least one second via includes a via extending from a lower surface of the second sealing member to the second re-distribution pattern to expose a portion of the second re-distribution pattern.

11. The stacked semiconductor package of claim 1, wherein at least one of the first semiconductor package and the second semiconductor package are a multi-chip packages.

12. The stacked semiconductor package of claim 1, wherein the at least one electrical connection device fills the at least one first via and the at least one second via.

13. The stacked semiconductor package of claim 12, wherein the at least one first via includes an upper part wider than a lower part and the at least one second via includes a lower part wider than an upper part.

* * * * *